United States Patent
Blaesing et al.

(10) Patent No.: US 9,630,499 B2
(45) Date of Patent: Apr. 25, 2017

(54) SCREEN-BASED VEHICLE OPERATING SYSTEM

(71) Applicant: Leopold Kostal GmbH & Co. KG, Luedenscheid (DE)

(72) Inventors: Frank Blaesing, Werl (DE); Ralf Boebel, Holzwickede (DE)

(73) Assignee: Leopold Kostal GmbH & Co. KG, Luedenscheid (DE)

( * ) Notice: Subject to any disclaimer, the term of this patent is extended or adjusted under 35 U.S.C. 154(b) by 0 days.

(21) Appl. No.: 15/054,240

(22) Filed: Feb. 26, 2016

(65) Prior Publication Data
US 2016/0176292 A1    Jun. 23, 2016

Related U.S. Application Data

(63) Continuation of application No. PCT/EP2014/068935, filed on Sep. 5, 2014.

(30) Foreign Application Priority Data

Sep. 9, 2013  (DE) .................. 10 2013 014 792

(51) Int. Cl.
*B60K 35/00* (2006.01)
*B60K 37/00* (2006.01)
(Continued)

(52) U.S. Cl.
CPC .............. *B60K 35/00* (2013.01); *B60K 37/00* (2013.01); *B60K 37/06* (2013.01); *B60R 11/0241* (2013.01); *B60R 11/0252* (2013.01); *B60R 11/0258* (2013.01); *G05G 1/015* (2013.01); *G05G 1/08* (2013.01); *G05G 5/03* (2013.01);

(Continued)

(58) Field of Classification Search
CPC .. B60K 35/00; B60K 37/00; B60K 2350/102; B60K 2350/1028; B60K 2350/104; B60K 2350/357; B60K 2350/925; B60K 2350/946; B60K 2350/948; B60K 37/06; B60R 11/0241; H01H 2003/506; H01H 19/11

See application file for complete search history.

(56) References Cited

U.S. PATENT DOCUMENTS 9,507,444 B2 * 11/2016 Maiwald ................ G01D 5/245
2004/0222980 A1 * 11/2004 Lee ....................... G06F 3/0362
345/184

(Continued)

FOREIGN PATENT DOCUMENTS

DE      102008041649 A1    3/2010
EP          2103476 A2     9/2009
(Continued)

OTHER PUBLICATIONS

European Patent Office, International Search Report for corresponding International Application No. PCT/EP2014/068935, dated Feb. 6, 2015.

*Primary Examiner* — Bernard Rojas
(74) *Attorney, Agent, or Firm* — Brooks Kushman P.C.

(57) ABSTRACT

A screen-based operating system includes a housing having a screen accommodated therein and a rotary ring rotatably mounted to the housing. A first part of the rotary ring is mounted axially into the housing and a remaining second part of the rotary ring extends out of the housing and above the screen.

20 Claims, 4 Drawing Sheets

(51) Int. Cl.
| | |
|---|---|
| *B60K 37/06* | (2006.01) |
| *B60R 11/02* | (2006.01) |
| *G05G 1/015* | (2008.04) |
| *G05G 1/08* | (2006.01) |
| *G05G 5/03* | (2008.04) |
| *G06F 3/041* | (2006.01) |
| *H03K 17/972* | (2006.01) |
| *G06F 3/01* | (2006.01) |
| *H05K 5/00* | (2006.01) |
| *B60R 11/00* | (2006.01) |
| *H01H 19/11* | (2006.01) |
| *H01H 3/50* | (2006.01) |
| *H03K 17/97* | (2006.01) |

(52) U.S. Cl.
CPC .............. *G06F 3/016* (2013.01); *G06F 3/041* (2013.01); *G06F 3/0412* (2013.01); *H03K 17/972* (2013.01); *H05K 5/0017* (2013.01); *B60K 2350/102* (2013.01); *B60K 2350/104* (2013.01); *B60K 2350/1028* (2013.01); *B60K 2350/357* (2013.01); *B60K 2350/925* (2013.01); *B60K 2350/946* (2013.01); *B60K 2350/948* (2013.01); *B60R 2011/0007* (2013.01); *B60R 2011/0075* (2013.01); *H01H 19/11* (2013.01); *H01H 2003/506* (2013.01); *H03K 2017/9706* (2013.01); *H03K 2217/94068* (2013.01)

(56) References Cited

U.S. PATENT DOCUMENTS

| | | | |
|---|---|---|---|
| 2010/0020042 A1* | 1/2010 | Stelandre | B60K 35/00 345/174 |
| 2010/0057273 A1* | 3/2010 | Heers | B60K 35/00 701/1 |

FOREIGN PATENT DOCUMENTS

| | | |
|---|---|---|
| EP | 2159455 A1 | 3/2010 |
| EP | 2161643 A2 | 3/2010 |
| WO | 2012080128 A1 | 6/2012 |

* cited by examiner

SCREEN-BASED VEHICLE OPERATING SYSTEM

CROSS-REFERENCE TO RELATED APPLICATIONS

This application is a continuation of International Application No. PCT/EP2014/068935, published in German, with an International filing date of Sep. 5, 2014, which claims priority to DE 10 2013 014 792.1, filed Sep. 9, 2013; the disclosures of which are hereby incorporated in their entirety by reference herein.

TECHNICAL FIELD

The present invention relates to a screen-based vehicle operating system having an operating device including a screen mounted in a housing and a mechanical operating element configured to rotate with respect to the housing, the mechanical operating element protruding partially into the display field of the screen.

BACKGROUND

Vehicle operating systems with a screen have become widely used in modern vehicles. The vehicle operating systems are used to control the vehicle and its components, both for controlling auxiliary devices such as navigation systems and multimedia entertainment systems, or for general driver assistance systems, especially in connection with camera-based applications. On the one hand, touch screens are used as input elements for an operator to input commands, and on the other hand, conventional mechanical operating elements are used as input elements for the operator to input commands. In comparison to the operation using touch screens, mechanical operating elements have the advantage of enabling haptic feedback with respect to the control operation being carried out.

DE 10 2008 041 649 A1 (corresponding to U.S. Publication No. 2010/0057273) describes a screen-based vehicle operating system having a screen and mechanical operating elements. The screen is configured to image an input interface and is a touch screen. The mechanical operating elements are in the form of rotary knobs. The rotary knobs protrude partially into the display field of the screen. The portions of the rotary knobs protruding into the display field of the screen block or cover this part of the screen.

SUMMARY

An object includes a screen-based operating system having a housing accommodating a screen and a mechanical operating element configured to rotate with respect to the housing, the mechanical operating element protruding partially into the display field of the screen, and the mechanical operating element has a stable support with only minor blocking or covering of the display field of the screen.

In carrying out at least one of the above and/or other objects, a screen-based operating system is provided. The operating system includes a housing having a screen accommodated therein and a rotary ring rotatably mounted to the housing. A first part of the rotary ring is mounted axially into the housing and a remaining second part of the rotary ring extends out of the housing and above the screen.

The housing may include a magnet arrangement and the rotary ring may include another magnet arrangement. The magnet arrangements cooperate through magnetic field interaction to generate mechanical latching, and thereby haptic feedback, when the rotary ring rotates.

The housing may include a cradle for receiving a mobile device having the screen for the housing to accommodate the screen.

In carrying out at least one of the above and/or other objects, another screen-based operating system is provided. This operating system includes a housing having a cradle for receiving a mobile device having a screen and a mechanical operating element rotatably mounted to the housing. A first part of the mechanical operating element is embedded into the housing and a remaining second part of the mechanical operating element extends out of the housing and above a screen of a mobile device received in the cradle of the housing. The mechanical operating element may be a rotary ring.

An embodiment provides a screen-based operating system having at least one screen and an operating device having at least one mechanical operating element. The screen is accommodated in a receiving portion of the housing. The mechanical operating element is rotatably mounted in relation to the housing such that the mechanical operating element is rotatable relative to the screen. The mechanical operating element is arranged to partially protrude into the display field of the screen thereby partially covering the screen. The mechanical operating element is in the form of a rotary or rotating ring. One part of the circumference or periphery of the rotary ring is let into the housing in an axial direction and a remaining second part of the circumference or periphery of the rotary ring projects completely out of the housing and extends at least partly over the surface of the screen.

In embodiments, the screen-based operating system involves a suitable mechanical operating element and its relationship or mapping to the screen. The mechanical operating element is assured a stable support with minor or relatively little blocking or covering of the usable display area of the screen by the mechanical operating element. This is achieved by implementing the mechanical operating element as a rotary ring. The rotary ring includes a first rotary ring part of the periphery or circumference of the rotary ring and a remaining second rotary ring part of the periphery or circumference of the rotary ring. The first rotary ring part is embedded or flush mounted axially into the housing. The second rotary ring part protrudes completely out of the housing and extends at least partially above the surface of the screen.

In an embodiment, an arrangement of permanent magnets forming magnetic poles is mounted in the rotary ring and magnetic field generating means are arranged in the housing. The permanent magnets of the rotary ring and the magnetic field generating means of the housing cooperate to form a latching mechanism or detent device.

In an embodiment, the magnetic field generating means of the housing are also an arrangement of permanent magnets forming magnetic poles. The permanent magnets of the housing are arranged in the housing with the same raster or grid spacing on the same circular radius and in the same longitudinal orientation and polarity as the permanent magnets of the rotary ring.

In an embodiment, at least one magnetic field sensor is located in the housing. The permanent magnets of the rotary ring cooperate with the magnetic field sensor of the housing to produce an output signal.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
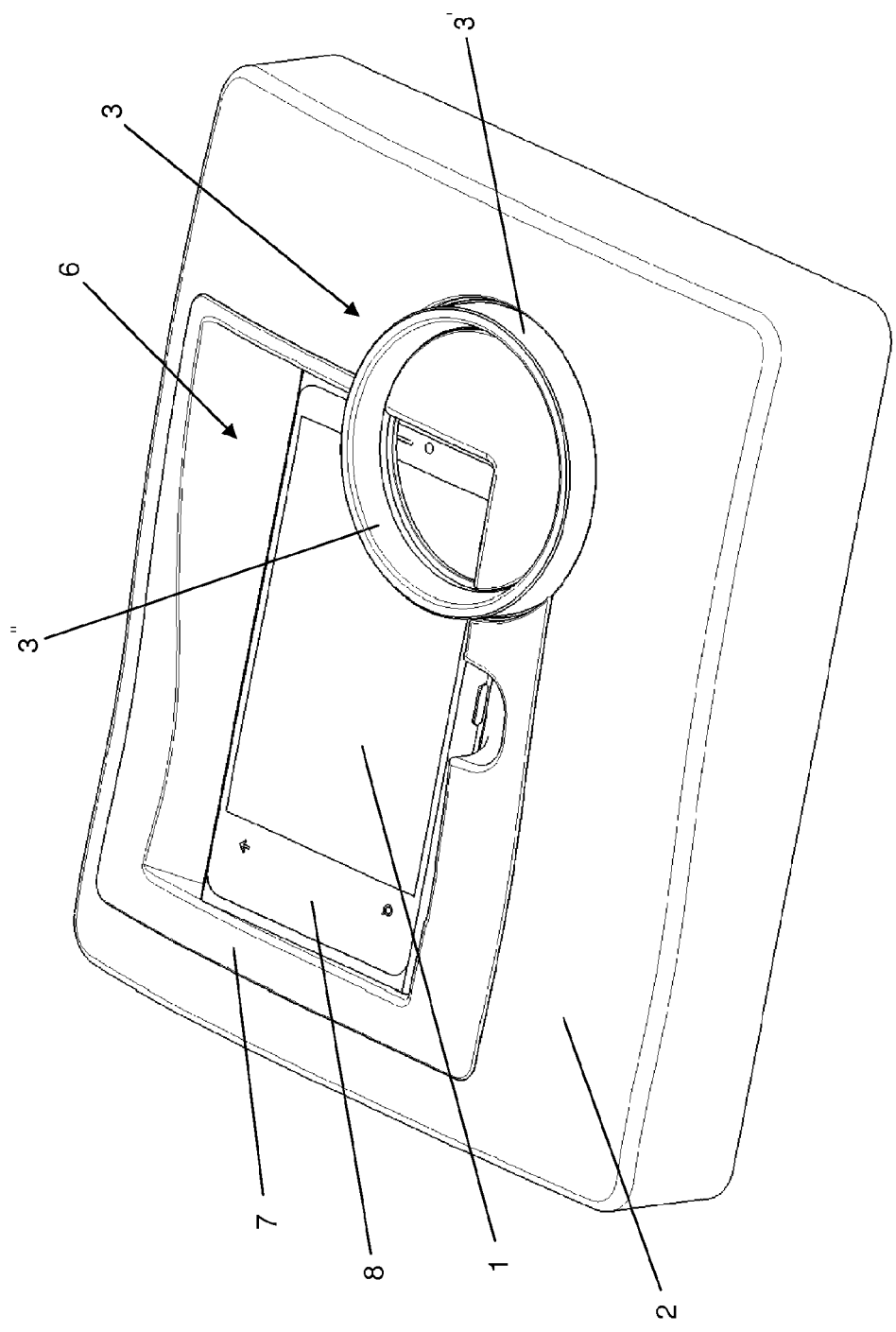
FIG. 1 illustrates an operating device of a screen-based operating system in accordance with an embodiment of the present invention.

Referring now to FIG. 1, an operating device of a screen-based operating system in accordance with an embodiment of the present invention is shown. The operating device includes a housing 2. Housing 2 has a recess 6 which is part of a receiving portion (or cradle) 7 of the housing. Cradle 7 is for receiving a mobile device 8 having a touch screen 1.

Mobile device 8 is, for example, a smart phone with a touch sensitive screen 1 as shown. Cradle 7 thereby includes a tray that forms recess 6 and is designed as an interchangeable part of housing 2. Different mobile devices 8 can thus be inserted into electrically and mechanically adapted cradles 7. The single functional component of the operating device that forms screen 1 is thus physically part of mobile device 8.

Mobile device 8 is connected to the operating device through a data communication interface (not shown). This interface can, for example, be designed as a plug-in connector. The connection may be made by wireless technology using WLAN or Bluetooth. Mobile device 8 is thereby connected through a similarly preferred wireless energy transmission interface through which the internal battery of mobile device 8 can be charged inductively.

Figure 2:
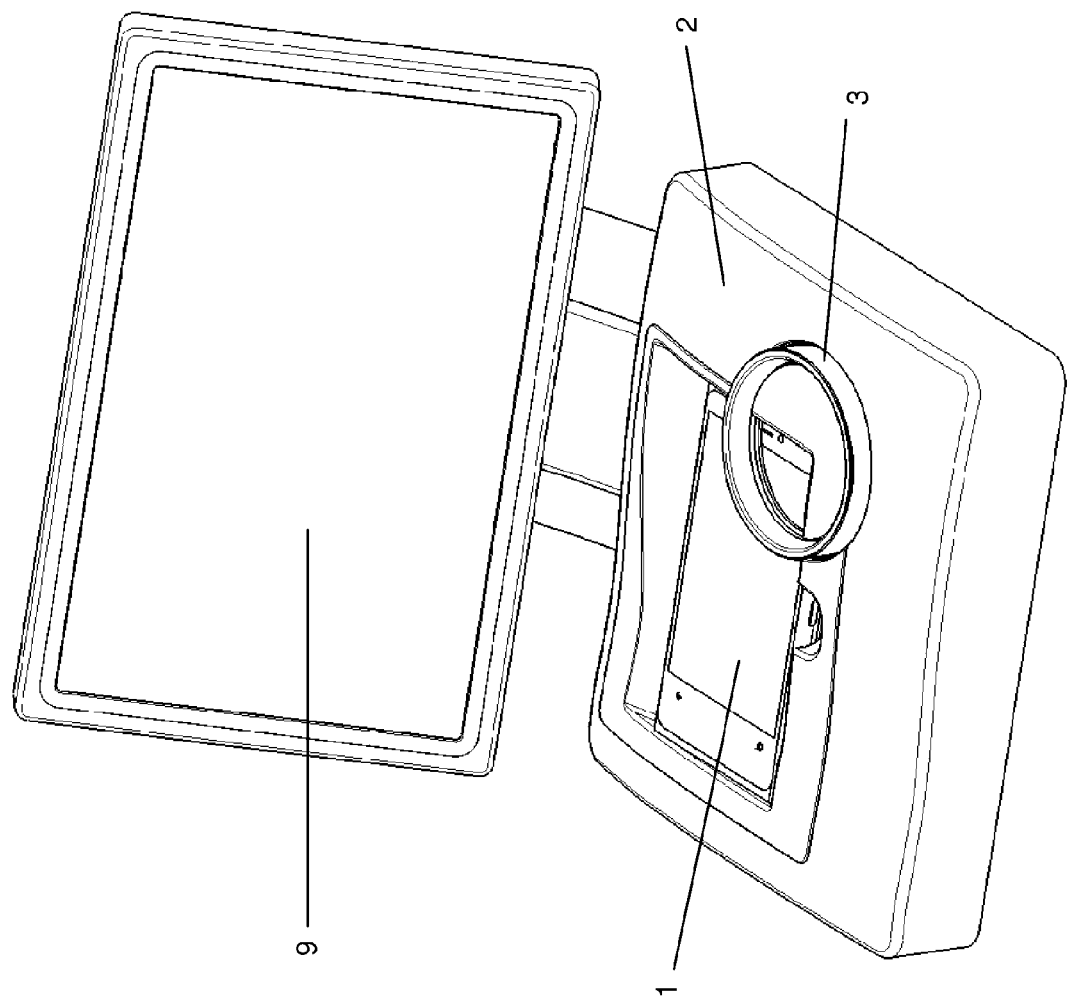
FIG. 2 illustrates a schematic view of the operating device integrated into a center console of a vehicle.

Referring now to FIG. 2, with continual reference to FIG. 1, a schematic view of the operating device integrated into a center console of a vehicle is shown. As shown, housing 2 of the operating device is part of the lower, horizontal section of the center console of the vehicle. Screen 1 of mobile device 8 serves as the input interface for the operating device through its touch function. Screen 1 of mobile device 8 also serves to provide supportive display functions. An additional screen 9 is present in the upper, vertical part of the center console of the vehicle. Additional screen 9 may display content that relates to the vehicle being controlled or the operation of auxiliary devices.

In addition to the touch function of screen 1 of mobile device 8 as an input interface of the operating device, the operating device further includes a mechanical operating element as another input element of the operating device. The mechanical operating element is in the form of a rotary ring 3. Rotary ring 3 is mounted so that it can rotate with respect to housing 2. Rotary ring 3 is arranged in housing 2 so that it protrudes partially into the display field of screen 1.

Rotary ring 3 includes a first rotary ring part 3' of the periphery or circumference of the rotary ring and a remaining second rotary ring part 3" of the periphery or circumference of the rotary ring. First rotary ring part 3' is embedded or inserted axially into housing 2. As shown best in FIGS. 1 and 2, first rotary ring part 3' accounts for about three quarters of the circumference of rotary ring 3.

Figure 3:
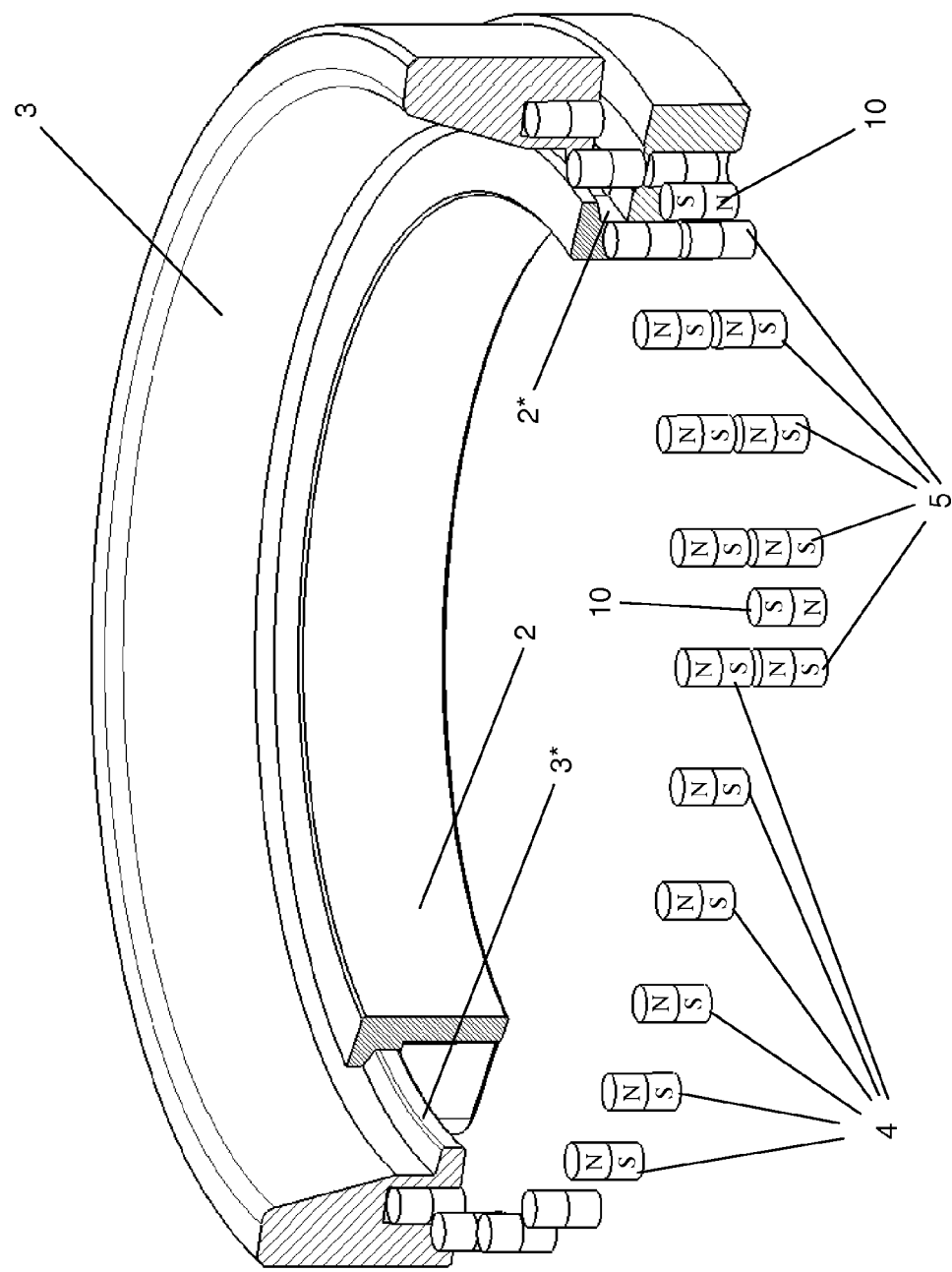
FIG. 3 illustrates a partial section of the rotary ring of the operating device and its bearing in the housing of the operating device, as well as the permanent magnet arrangement of the rotary ring and the permanent magnet arrangement of the housing.

Referring now to FIG. 3, with continual reference to FIGS. 1 and 2, a partial section of rotary ring 3 and its bearing in housing 2 is shown. Rotary ring 3 includes a radially inwardly directed collar 3* on its lower end. Housing 2 includes a matching groove 2*. Collar 3* of rotary ring 3 cooperates with matching groove 2* of housing 2 to form a slide bearing.

Second rotary ring part 3" protrudes completely out of housing 2 and extends at least partially above the surface of screen 1. Second rotary ring part 3" extends into recess 6, which is part of cradle 7 for mobile device 8, and is thus also at least section-wise above the surface of screen 1 of mobile device 8 inserted there. As shown best in FIGS. 1 and 2, second rotary ring part 3" accounts for about the remaining one quarter of the circumference of rotary ring 3.

The designation of first and second rotary ring parts 3' and 3" used herein for the circumference or periphery of rotary ring 3, which are inserted into housing 2 or protrude completely out of the housing, can be understood dynamically since the rotary ring parts are continually changing during rotation of the rotary ring. By forming the mechanical operating element as rotary ring 3 and not as a rotary knob, a significantly smaller portion of the display surface of screen 1 is covered or blocked by the rotary ring. This allows interesting display and operating possibilities from the use of the display area "inside" rotary ring 3. Thus, an actuating or confirmation key can be provided as a touch function on screen 1 approximately in the center of rotary ring 3.

Figure 4:
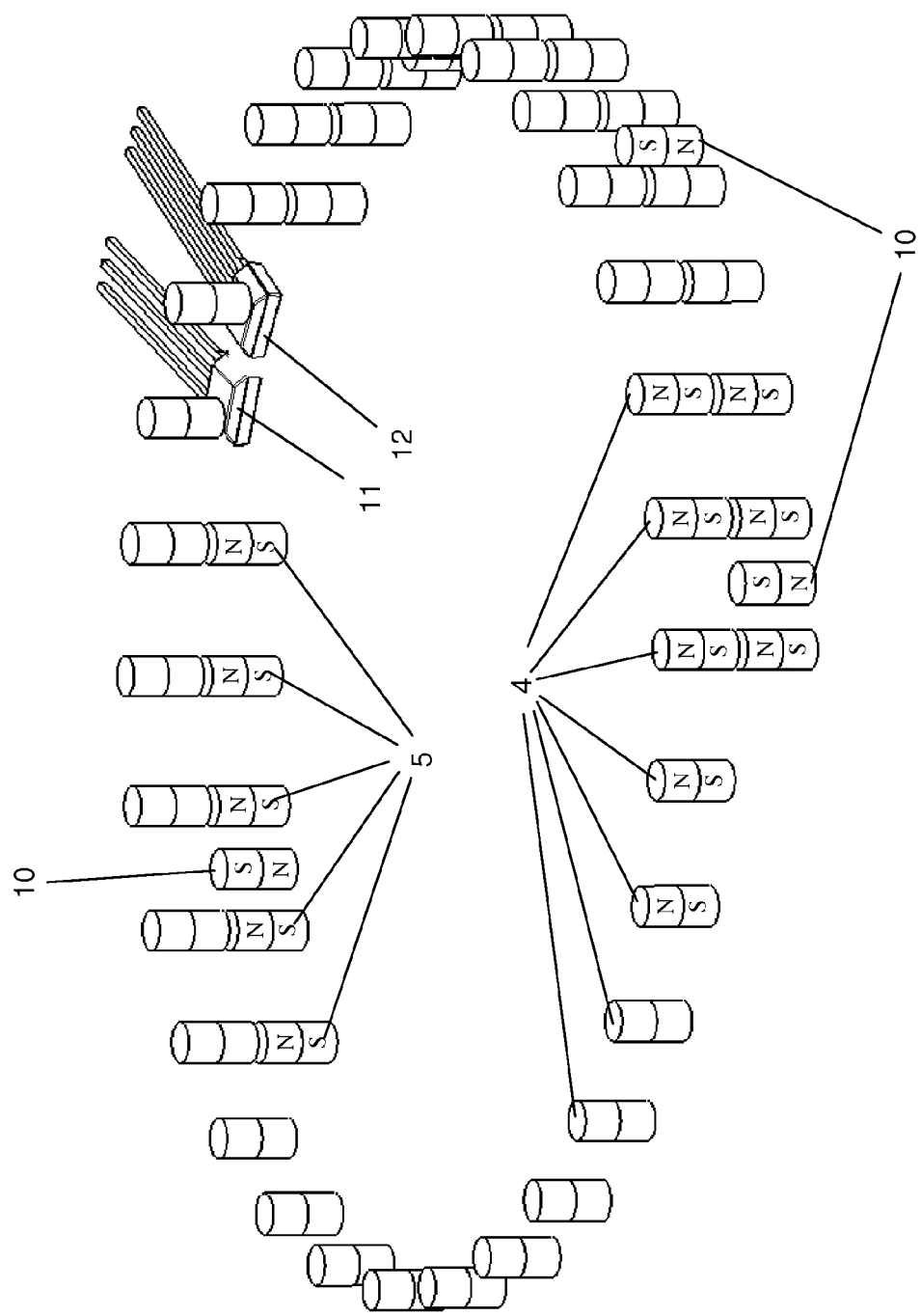
FIG. 4 illustrates the permanent magnet arrangement of the rotary ring, the permanent magnet arrangement of the housing, and magnetic field sensors, in the form of Hall sensors, of the housing.

Referring further to FIG. 3 and to FIG. 4, with continual reference to FIGS. 1 and 2, permanent magnet arrangements of rotary ring 3 and housing 2 are shown. The permanent magnet arrangements of rotary ring 3 and housing 2 cooperate through magnetic field interaction to generate mechanical latching, and thereby haptic feedback, when rotary ring 3 is actuated to rotate.

The permanent magnet arrangement of rotary ring 3 includes a plurality of distributed permanent magnets 4. Magnets 4 are arranged in rotary ring 3 over the circumference of the rotary ring with raster spacing. Magnets 4 of rotary ring 3 are implemented as bar magnets whose longitudinal axes are oriented axially, and thus parallel to the axis of rotation of rotary ring 3, and with the same magnetization orientation. In this case, the south poles of magnets 4 point downwardly.

Housing 2 includes magnetic field generating means. In one form, the magnetic field generating means are formed by the permanent magnet arrangement of housing 2. The permanent magnet arrangement of housing 2 includes a plurality of distributed permanent magnets 5. Magnets 5 of housing 2 are arranged in the portion of the housing adjacent to first rotary ring part 3. Some of magnets 5 may be arranged as part of cradle 7 of housing 2. Magnets 5 are also implemented as bar magnets whose longitudinal axes are oriented axially, and thus parallel to the axis of rotation of rotary ring 3, and with the same magnetization orientation. In this case, the south poles of magnets 5 point downwardly.

Magnets 5 are provided in cooperation with magnets 4 to produce the desired detent mechanism. Magnets 5 are arranged in housing 2 with the same detent spacing, on the same circular radius, and in the same longitudinal orientation and polarity as magnets 4 in rotary ring 3. As such, in a latching position, and thus in a stable equilibrium state, a south pole of a given magnet 4 in rotary ring 3 lies opposite a north pole of a given magnet 5 in housing 2. The forces of attraction between these magnets 4 and 5 produce the latching force.

A single magnet 5 of housing 2 would in principle suffice to produce such a latching action with one of magnets 4 of rotary ring 3. With regard to the actual number of magnets 5 used in housing 2, their sizes and strengths as well as their axial distance to magnets 4 of rotary ring 3 allow the strength of the latching force to be adjusted. Magnets 5 in housing 2 can also be arranged at a larger or smaller circular radius than magnets 4 in rotary ring 3, which thereby provides an additional parameter for modifying the strength and behavior of the latching force.

Other forms of permanent magnets can be used in addition to bar magnets 4 and 5, both in rotary ring 3 and in housing 2. In particular, use of resin-bonded magnets can be considered, which can be magnetized according to a desired pattern. On the housing side, a magnetic arrangement created from coils and pole pieces can be used whose magnetic field strengths can be varied by changing the coil current.

In the arrangement of magnets 4 and 5, an unstable equilibrium position exists between two latching positions in which rotary ring 3 could pause. In order to avoid this situation, at least one additional magnet 10 of the opposite polarity can be inserted on the housing side in the middle between neighboring magnets 5 of housing 2. FIG. 4 indicates the presence of a plurality of these oppositely oriented magnets 10. Magnets 10 also give rise to a slight lifting motion of rotary ring 3 within its bearing caused by the repulsive force that acts on the rotary ring in the intermediate position between two latching positions, which can be used to achieve another fine adjustment of the haptics.

One or more of the additional magnets 10 having opposite polarities in housing 2 is/are retained in slightly oversized chambers that permit motion in the axial direction, in contrast to the remaining magnets 5 of housing 2 as well as magnets 4 of rotary ring 3, which are held in place by an adhesive bond or a tight fit. Due to the changes in the magnetic fields that arise at the position of these magnets 10 caused by turning rotary ring 3, magnets 10 are moved up and down and produce a clicking sound when striking against the end walls of their chambers. The clicking sound is sensed by the operator as additional acoustical feedback of the latching process.

Two magnetic field sensors 11 and 12 are placed in a larger intermediate space of the permanent magnet arrangement of housing 2. Magnetic field sensors 11 and 12 of housing 2, implemented as Hall sensors for example, detect the magnetic fields of magnets 4 of rotary ring 3. This is shown in FIG. 4, wherein the housing parts are not depicted, but only the arrangements of magnets 4 of rotary ring 3 and magnets 5 and magnetic field sensors 11 and 12 of housing 2. The mutual angular distance between the two magnetic field sensors 11 and 12 is smaller than the angular distance between neighboring magnets 4 of rotary ring 3. Preferably, the angular distance between the two magnetic field sensors 11 and 12 is about half the angular distance between neighboring magnets 4 of rotary ring 3.

Magnetic field sensors 11 and 12 measure changes in the magnetic field strengths that prevail at the position of the magnetic field sensors caused by rotational motion of rotary ring 3. The measured magnetic field strength changes may be used by downstream electronics to determine the direction of rotation, the rotational speed, and from this the angle of rotation of rotary ring 3. The information obtained in this manner forms the input data for the operating device. The direction of rotation, the rotational speed, and the angle of rotation of rotary ring 3 can alternatively also be obtained from non-contacting optical or capacitive quasi-touch screens of the next generation directly by these means of structuring the rotary ring that is detectable by the technology used here.

The bearing for rotary ring 3 as shown in FIG. 3 can itself be contained in housing 2 in an additional bearing in such a manner that it can produce a tipping motion having a relatively small tipping angle. By utilizing such a tipping motion for actuating associated switching elements or producing suitable signals through the screen, an additional operational input can thereby be envisioned by pressing on rotary ring 3.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A screen-based operating system comprising:
a housing having a screen accommodated therein; and
a rotary ring rotatably mounted to the housing, the rotary ring having a circumference, first part of the circumference of the rotary ring being mounted axially into the housing and a remaining second part of the circumference of the rotary ring extending out of the housing and above the screen.

2. The screen-based operating system of claim 1 wherein:
the second part of the circumference of the rotary ring extending out of the housing and above the screen partially blocks the screen with a display area of the screen within the center of the rotary ring not being blocked.

3. The screen-based operating system of claim 1 wherein:
the rotary ring includes a collar and the housing includes a matching groove, and the collar of the rotary ring cooperates with the matching groove of the housing to form a slide bearing to enable the rotary ring to rotate relative to the housing.

4. A screen-based operating system comprising:
a housing having a screen accommodated therein;
a rotary ring rotatable mounted to the housing, a first part of the rotary ring being mounted axially into the housing and a remaining second part of the rotary ring extending out of the housing and above the screen; and
wherein the housing includes a magnet arrangement and the rotary ring includes another magnet arrangement, the magnet arrangements cooperate through magnetic field interaction to generate mechanical latching, and thereby haptic feedback, when the rotary ring rotates.

5. The screen-based operating system of claim 4 wherein:
the magnet arrangement of the rotary ring includes a plurality of permanent magnets distributed over the circumference of the rotary ring.

6. The screen-based operating system of claim 5 wherein:
the magnet arrangement of the housing includes a plurality of permanent magnets distributed in the housing adjacent to a perimeter of the first part of the rotary ring.

7. The screen-based operating system of claim 6 wherein:
the permanent magnets of the housing and the permanent magnets of the rotary ring are arranged with the same raster spacing, on the same circular radius, and in the same longitudinal direction and polarity.

8. The screen-based operating system of claim 7 wherein:
the housing further includes at least one additional magnet of the opposite polarity of the permanent magnets of the magnet arrangement of the housing, the additional magnet being disposed in the middle between respective neighboring permanent magnets of the magnet arrangement of the housing in order to prevent an unstable equilibrium position exists between two latching positions in which the rotary ring could pause.

9. The screen-based operating system of claim 8 wherein:
at least one of the at least one additional magnet of the housing is respectively retained in a chamber that permits axial motion of the at least one of the at least one additional magnet of the housing, the at least one of the at least one additional magnet of the housing axially moving up and down and produce, for an operator to hear, a clicking sound when striking against end walls of the chamber due to changes in magnetic fields caused by rotation of the rotary ring.

10. The screen-based operating system of claim 5 wherein:
the housing further includes at least one magnetic field sensor configured to cooperate with the permanent magnets of the rotary ring to produce an output signal.

11. The screen-based operating system of claim 4 wherein:
the housing further includes a cradle for receiving a mobile device having the screen for the housing to accommodate the screen.

12. The screen-based operating system of claim 11 wherein:
the mobile device received within the cradle is connected an operating device having the housing and the rotary ring through a wireless data communication interface.

13. The screen-based operating system of claim 12 wherein:
the mobile device received within the cradle is connected to an operating device having the housing and the rotary ring through a wireless energy transmission interface.

14. The screen-based operating system of claim 4 wherein:
the housing is mounted in a vehicle.

15. A screen-based operating system comprising:
a housing having a cradle for receiving a mobile device having a screen; and
a mechanical operating element rotatably mounted to the housing, a first part of the mechanical operating element being embedded into the housing and a remaining second part of the mechanical operating element extending out of the housing and above a screen of a mobile device received in the cradle of the housing.

16. The screen-based operating system of claim 15 wherein:
the mechanical operating element is a rotary ring.

17. The screen-based operating system of claim 16 wherein:
the housing includes a magnet arrangement and the rotary ring includes another magnet arrangement, the magnet arrangements cooperate through magnetic field interaction to generate mechanical latching, and thereby haptic feedback, when the rotary ring rotates.

18. The screen-based operating system of claim 17 wherein:
the magnet arrangement of the rotary ring includes a plurality of permanent magnets distributed over the circumference of the rotary ring and the magnet arrangement of the housing includes a plurality of permanent magnets distributed in the housing adjacent to a perimeter of the first part of the rotary ring.

19. The screen-based operating system of claim 18 wherein:
the housing further includes at least one additional magnet of the opposite polarity of the permanent magnets of the magnet arrangement of the housing, the additional magnet being disposed in the middle between respective neighboring permanent magnets of the magnet arrangement of the housing in order to prevent an unstable equilibrium position exists between two latching positions in which the rotary ring could pause.

20. The screen-based operating system of claim 19 wherein:
at least one of the at least one additional magnet of the housing is respectively retained in a chamber that permits axial motion of the at least one of the at least one additional magnet of the housing, the at least one of the at least one additional magnet of the housing axially moving up and down and produce, for an operator to hear, a clicking sound when striking against end walls of the chamber due to changes in magnetic fields caused by rotation of the rotary ring.

* * * * *